United States Patent
Furugori

(10) Patent No.: US 7,750,559 B2
(45) Date of Patent: Jul. 6, 2010

(54) ORGANIC ELECTROLUMINESCENT ELEMENT ARRAY

(75) Inventor: Manabu Furugori, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 318 days.

(21) Appl. No.: 11/845,563

(22) Filed: Aug. 27, 2007

(65) Prior Publication Data

US 2008/0054797 A1 Mar. 6, 2008

(30) Foreign Application Priority Data

Aug. 29, 2006 (JP) .............................. 2006-232354

(51) Int. Cl.
  *H01J 1/63* (2006.01)
  *H01J 9/20* (2006.01)
(52) U.S. Cl. ........................ 313/504; 313/498; 313/503; 445/23; 445/24; 445/25
(58) Field of Classification Search .................. 313/504
See application file for complete search history.

(56) References Cited

U.S. PATENT DOCUMENTS

| | | | | |
|---|---|---|---|---|
| 6,365,270 | B2 * | 4/2002 | Forrest et al. | 428/336 |
| 6,969,948 | B2 * | 11/2005 | Urabe et al. | 313/506 |
| 7,102,282 | B1 | 9/2006 | Yamada et al. | 313/506 |
| 7,218,049 | B2 | 5/2007 | Yamada et al. | 313/506 |
| 2003/0034938 | A1 | 2/2003 | Yamada | 345/76 |
| 2007/0272921 | A1 | 11/2007 | Furugori | 257/40 |
| 2009/0026921 | A1 * | 1/2009 | Kuma et al. | 313/504 |

FOREIGN PATENT DOCUMENTS

| | | | |
|---|---|---|---|
| EP | 1154676 A1 * | 11/2001 | |
| EP | 1 672 962 A1 | 9/2004 | |
| WO | WO 01/39554 | 5/2001 | |
| WO | WO 2006095728 A1 * | 9/2006 | |

* cited by examiner

*Primary Examiner*—Bumsuk Won
*Assistant Examiner*—Nathaniel J Lee
(74) *Attorney, Agent, or Firm*—Fitzpatrick, Cella, Harper & Scinto

(57) ABSTRACT

An organic electroluminescent (EL) element array includes a substrate, a first organic EL element emitting red light, a second organic EL element emitting green light, and a third organic EL element emitting blue light. The first, second, and third organic EL elements each include a first electrode, an organic compound layer, and a light-transmissive second electrode arranged on the substrate in that order. The second electrode of the first organic EL element has a semitransparent reflective layer. The first electrode of the first organic EL element has a reflective face and a resonant structure located between the reflective face and the semitransparent reflective layer. The second and third organic EL elements each has a resonant structure located between a reflective face of the first electrode of the second or third organic EL element and a light-extracting face of the transparent layer of the second or third organic EL element.

5 Claims, 3 Drawing Sheets

ORGANIC ELECTROLUMINESCENT ELEMENT ARRAY

BACKGROUND OF THE INVENTION

1. Field of the Invention

The present invention relates to an organic electroluminescent element array (hereinafter referred to as an organic EL element array) including a plurality of organic electroluminescent elements (hereinafter referred to as organic EL elements).

2. Description of the Related Art

In recent years, organic EL elements have been widely investigated. The organic EL elements each typically include an anode, a cathode, and an organic compound layer which is disposed between the anode and the cathode and which includes a light-emitting sublayer. Holes and electrons which are injected into the organic compound layer by applying a voltage between the anode and the cathode are recombined with each other in the light-emitting sublayer, whereby light is emitted from the light-emitting sublayer. An array of the organic EL elements can be used as a display. In particular, a full-color display can be formed by arraying organic EL elements emitting light of different colors.

Since current organic EL elements lack desired light-emitting efficiency, they need to be improved in their light-emitting efficiency. One way to improve light-emitting efficiency is to use constructive optical interference.

International Publication WO 01/039554 (hereinafter referred to as Patent Document 1) discloses an organic EL element having a resonant structure consisting of a first electrode made of a light-reflective material, an organic layer serving as a resonant section, and a translucent reflective layer. Patent Document 1 also discloses an organic EL element including a first electrode made of a light-reflective material and serving as a cathode; a second electrode made of a transparent material and serving as an anode; and an organic layer that forms a resonant section together with the second electrode. In this organic EL element light emitted from the organic layer is reflected between the lower end of the organic layer (that is, the interface between the organic layer and the first electrode) and the upper end of the second electrode (that is, the interface between the second electrode and air).

As disclosed in Patent Document 1, the optical path of each resonant section is adjusted to a positive minimum value such that the organic EL elements satisfy the following equation:

$$2L/\lambda + \Phi/2\Pi = m$$

wherein L represents the optical path of the resonant section, $\lambda$ represents the wavelength of light extracted from the organic EL element, $\Phi$ represents the sum of the phase shifts at both ends of the resonant section, and m represents a positive integer.

Since the optical path thereof is adjusted to such a positive minimum value, the chromaticity of the organic EL element can be improved over a wide range of a view angle.

When that the organic EL elements disclosed in Patent Document 1 satisfy the above equation, the optical path of each resonant section has a positive minimum value. Hence, m, which is the order of interference, is equal to one.

When the optical path thereof has a positive minimum value, each organic layer has a minimum thickness. A reduction in the wavelength of light emitted from each organic EL element leads to a reduction in the thickness of the organic layer. Furthermore, an increase in the number of sublayers in the organic layer, which is included in the resonant section, leads to a reduction in the thickness of each sublayer.

An excessive reduction in the thickness of the organic layer prevents formation of the sublayers having uniform thickness. This causes problems such as short circuits, current leakage and/or a problem in that the ability to transport charges and/or the ability to emit light is impaired. In organic EL element arrays including three types of elements; that is, red light-emitting elements (hereinafter referred to as R elements), green light-emitting elements (hereinafter referred to as G elements), and blue light-emitting elements (hereinafter referred to as B elements), the above problems are likely to occur in the B or G elements.

If the thickness of the organic layer is increased such that m is greater than or equal to two, then the problems of impaired ability to transport charges and/or impaired ability to emit light can be prevented. However, an increase in the thickness of the organic layer may cause corresponding problems in that voltage for driving the organic EL element is increased and/or the view angle is reduced (as disclosed in Patent Document 1) because the order of interference is high.

SUMMARY OF THE INVENTION

The present invention provides an organic EL element array in which the thickness of each organic layer is not excessively large or small and R, G, B elements have high light extraction efficiency.

In the present invention, elements emitting red light each include an organic layer which serves as a resonant section and of which the optical path is set such that the order of interference is equal to one. On the other hand, elements emitting green light and elements emitting blue light each include an organic layer and a second electrode (a light-extracting electrode). The sum of the optical path of this organic layer and that of the second electrode layer is set such that the order of interference is equal to two.

An organic EL element array according to the present invention includes a substrate, first organic EL elements emitting red light, second organic EL elements emitting green light, and third organic EL elements emitting blue light. The first, second, and third organic EL elements are disposed on the substrate and each include a first electrode, an organic compound layer, and a light-transmissive second electrode arranged on the substrate in that order. The organic compound layer emits light, which is extracted through the second electrode. The second electrode of each first organic EL element has a semitransparent reflective layer. The first electrode of the first organic EL element has a reflective face and a resonant structure located between the reflective face and the semitransparent reflective layer. The second electrode of each second organic EL element and the second electrode of each third organic EL element each have a transparent layer having a light-extracting face through which light is extracted. The first electrode of the second organic EL element and the first electrode of the third organic EL element each have a reflective face. The second and third organic EL elements each has a resonant structure located between the reflective face of the first electrode of the second or third organic EL element and the light-extracting face of the transparent layer of the second or third organic EL element. The optical path between the reflective face of the first electrode of the first organic EL element and the semitransparent reflective layer and the optical path between the reflective face of the first electrode of the second or third organic EL element and the light-extracting face of the transparent layer of the second or third organic EL element each satisfy one of the following equations:

$$2L_1/\lambda_1+\Phi_1/2\Pi=1$$

$$2L_2/\lambda_2+\Phi_2/2\Pi=2$$

wherein $L_1$ represents the optical path between the reflective face of the first electrode of the first organic EL element and the semitransparent reflective layer, $L_2$ represents the optical path between the reflective face of the first electrode of the second or third organic EL element and the light-extracting face of the transparent layer of the second or third organic EL element, $\lambda_1$ represents the peak wavelength of the emission spectrum of the first organic EL element, $\lambda_2$ represents the peak wavelength of the emission spectrum of the second or third organic EL element, $\Phi_1$ represents the sum of the phase shift at the reflective face of the first electrode of the first organic EL element and the phase shift at the semitransparent reflective layer; and $\Phi_2$ represents the sum of the phase shift at the reflective face of the first electrode of the second or third organic EL element and the phase shift at the light-extracting face of the transparent layer of the second or third organic EL element.

According to the organic EL element array, reflection positions for causing resonance can be varied in such a manner that the second electrode of the first organic EL element, the second electrode of the second organic EL element, and the second electrode of the third organic EL element are prepared from different materials.

The order of interference of each of the second and third organic EL elements is adjusted to two, whereby the optical path thereof, which is necessary to cause interference, is increased. Since the second electrode of each of the second and third organic EL elements includes the transparent layer, the optical path includes the thickness of the transparent layer. This prevents the organic compound layer from having an excessively small or large thickness. Therefore, light can be efficiently extracted from the first, second, and third organic EL elements without causing short circuits, current leakage, and/or an increase in driving voltage.

Further features of the present invention will become apparent from the following description of exemplary embodiments with reference to the attached drawings.

DESCRIPTION OF THE PREFERRED EMBODIMENTS

Figure 1:
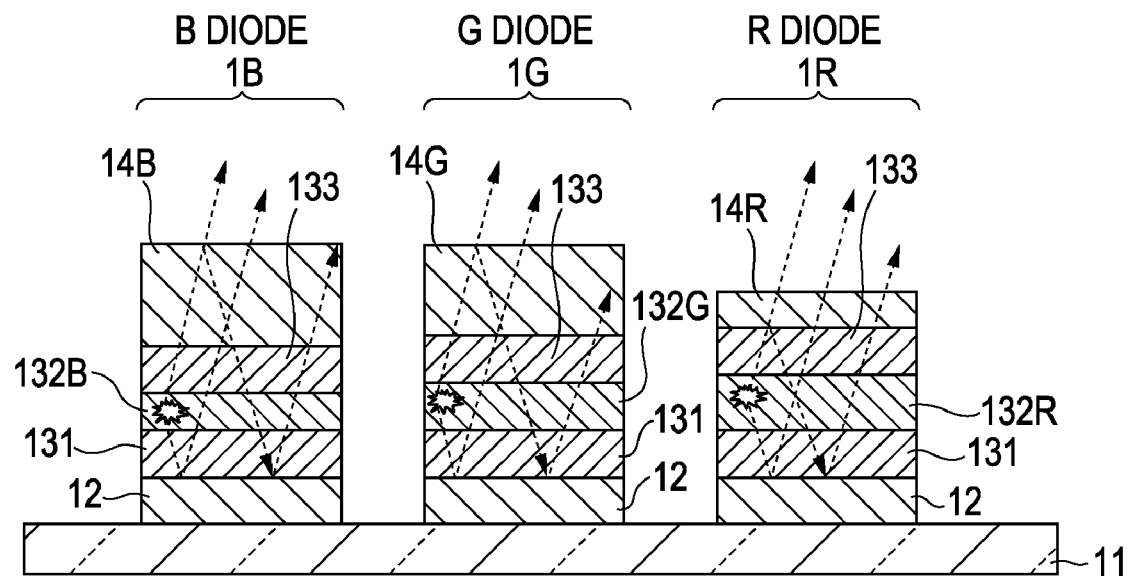
FIG. 1 is a schematic sectional view of an organic EL element array according to a first embodiment of the present invention.

An organic EL element array according to the present invention includes organic EL elements emitting red light (hereinafter referred to as R elements), organic EL elements emitting green light (hereinafter referred to as G elements), and organic EL elements emitting blue light (hereinafter referred to as B elements). The R, G, and B elements each include a first electrode, a light-transmissive second electrode, and an organic compound layer which is disposed therebetween and which emits light.

The R, G, and B elements are different from each other in reflection position for resonance. In particular, the second electrode of each R element includes a semitransparent reflective layer and the first electrode of the R element has a reflective face. In the R element, the reflective face of the first electrode and a face of the second electrode that is located on the first electrode side correspond to reflection positions for causing resonance. The first electrode of the each of the G and B elements has a reflective face and the second electrode of each of the G and B elements includes a transparent layer and has a light-extracting face through which light is extracted. In each of the G and B elements, the reflective face of the first electrode and the light-extracting face of the second electrode correspond to reflection positions for causing resonance.

Conditions for enhancing the light extraction efficiency of the R element by resonance are represented by the following equation:

$$2L_1/\lambda_1+\Phi_1/2\Pi=1 \quad (1)$$

wherein $L_1$ represents the optical path between the first and second electrodes, $\lambda_1$ represents the peak wavelength of the emission spectrum of the R element, $\Phi_1$ represents the sum of the phase shift at the reflective face of the first electrode and the phase shift at the light-extracting face of the second electrode. Thus, in the R element, the order of interference is one.

The term "phase shift" means the change in phase of a reflected light wave. The phase shift depends on the refractive index of layers with a reflective face (interface) therebetween. The refractive index of a layer can be determined in such a manner that a desired layer such as a reflective layer, a translucent layer, or a transparent layer is formed on a substrate made of, for example, quartz or silicon. This construct is then measured for refractive index with an ordinary optical analyzer, such as a spectroscopic ellipsometer, available from, for example, Horiba Ltd. or an optical thin-film analyzer available from, for example, SCI.

The emission spectrum of the R element has a longer peak wavelength as compared to that of each of the G and B elements. Hence, the organic compound layer of the R element does not have an excessively small thickness even if the order of interference is one. Resonant conditions can be controlled by adjusting the thickness of the organic compound layer thereof. This allows light to be efficiently extracted from the R element.

Conditions for enhancing the light extraction efficiency of each of the G and B elements by resonance are represented by the following equation:

$$2L_2/\lambda_2+\Phi_2/2\Pi=2 \quad (2)$$

wherein $L_2$ represents the optical path between the first and second electrodes of each G or B element, $\lambda_2$ represents the peak wavelength of the emission spectrum of the G or B element, $\Phi_2$ represents the sum of the phase shift at the reflective face of the first electrode of the G or B element and the phase shift at the light-extracting face of the second electrode of the G or B element. Thus, in the G or B element, the order of interference is two.

The emission spectrum of each of the G and B elements has a shorter peak wavelength as compared to that of the red element. Hence, when the order of interference is one, the organic compound layer of each of the G and B elements has an excessively small thickness. Alternatively, when the order of interference is two and the second electrode of each of the G and B elements as well as the R element includes a semitransparent reflective layer, the organic compound layer of each of the G and B elements has an excessively large thickness. Therefore, the order of interference is maintained at two and the light-extracting face of the second electrode of each of the G and B elements is used to reflect light, whereby the transparent layer of the second electrode thereof can be used to control the G and B elements to meet resonant conditions. This prevents the organic compound layer of each of the G and B elements from having an excessively large thickness, but allows the organic compound layer to have an optimum thickness. Thus, light emitted from the organic compound layer thereof can be efficiently extracted from each of the G and B elements.

In the organic EL element array, the organic compound layers of the R, G, and B elements can be controlled to have an optimum thickness. This eliminates the problems of functional defects caused by an excessive reduction in the thickness of the organic compound layer thereof or that a driving voltage is unduly increased due to an excessive increase in the thickness thereof. This feature allows light emitted from each organic compound layer to be efficiently extracted from each of the R, G, and B elements.

Organic EL element arrays according to embodiments of the present invention will now be described with reference to the attached drawings.

First Embodiment

FIG. 1 shows an organic EL element array according to a first embodiment of the present invention in cross-section.

With reference to FIG. 1, the organic EL element array includes a substrate 11, R element 1R, G element 1G, and B element 1B. The R, G, and B elements 1R, 1G, and 1B are each arranged on substrate 11. The R elements each represented by 1R each include a first electrode 12, a first charge transport layer (hole transport layer) 131, a light-emitting layer 132R, a second charge transport layer (electron transport layer) 133, and a second electrode 14R in this sequence. The G elements represented by 1G each include a first electrode 12, a first charge transport layer (hole transport layer) 131, a light-emitting layer 132G, a second charge transport layer (electron transport layer) 133, and a second electrode 14G in this sequence. The B elements each represented by 1B each include a first electrode 12, a first charge transport layer (hole transport layer) 131, a light-emitting layer 132B, a second charge transport layer (electron transport layer) 133, and a second electrode 14B in this sequence.

In each R element 1R, the second electrode 14R includes a semitransparent reflective layer. Resonance causes light to be reflected between the interface between the first electrode 12 and the first charge transport layer 131 and the interface between the second electrode 14R and the second charge transport layer 133. The optical path between these interfaces satisfies Equation (1). The order of interference of the R element 1R is one. The semitransparent reflective layer allows a portion of light to pass therethrough and reflects the other portion of light. Therefore, the semitransparent reflective layer is preferably made of metal and preferably has a reflectance of 5% or more and a transmittance of 50% or more.

In each G element 1G, the second electrode 14G includes a transparent layer and resonance causes light to be reflected between the interface between the first electrode 12 and the first charge transport layer 131 and a light-extracting face of the second electrode 14G. The optical path between the interface and the light-extracting face satisfy Equation (2). In each B element 1B, the second electrode 14B includes a transparent layer and resonance causes light to be reflected between the interface between the first electrode 12 and the first charge transport layer 131 and a light-extracting face of the second electrode 14B. The optical path between this interface and this light-extracting face satisfy Equation (2). The order of interference of each of the G and B elements 1G and 1B is two.

The wavelength of light emitted from the G element 1G is different from that of light emitted from the B element 1B. Therefore, the optical path between the interface and light-extracting face of the G element 1G needs to be different from that of the B element 1B. As shown in FIG. 1, the light-emitting layer 132G of the G element 1G has a thickness different from that of the light-emitting layer 132B of the B element 1B. In particular, the light-emitting layer 132G of the G element 1G has a thickness greater than that of the light-emitting layer 132B of the B element 1B. Therefore, in each of the G and B elements 1G and 1B, members other than the light-emitting layer 132G and the light-emitting layer 132B may have the same thickness. The first charge transport layers 131 of the R, G, and B elements 1R, 1G, and 1B may be formed together and the second charge transport layers 133 of the R, G, and B elements 1R, 1G, and 1B may also be formed together. In this case, a film for forming the first charge transport layers 131 and a film for forming the second charge transport layers 133 can be used to fabricate the R, G, and B elements 1R, 1G, and 1B. Therefore, the organic EL element array can be manufactured by a simple method.

In order to allow the G element 1G and the B element 1B to have different optical paths, at least one of the first charge transport layer 131, second charge transport layer 133, and second electrode 14G of the G element 1G may have a thickness different from the thickness of that of B element 1B. When the second electrode 14G of the G element 1G has a thickness different from the thickness of the second electrode 14B of the B element 1B, a film for forming the first charge transport layers 131 and a film for forming the second charge transport layers 133 can be used to fabricate the R, G, and B elements 1R, 1G, and 1B. Therefore, the organic EL element array can be manufactured by a simple method.

Members of the organic EL element array will now be described in detail.

The substrate 11 is preferably a plate or a film and may be made of glass, plastic, or silicon. When the organic EL element array is an active matrix-type organic EL element array with a circuit for individually controlling elements, the substrate 11 may include thin-film transistors (TFTs). In order to prevent organic materials for forming the light-emitting layers 132R, 132B, and 132B of the R, G, and B elements 1R, 1G, and 1B from being mixed with each other or in order to prevent the R, G, and B elements 1R, 1G, and 1B from being short-circuited, the substrate 11 preferably includes a film for isolating the R, G, and B elements 1R, 1G, and 1B from each other.

The first and second charge transport layers 131 and 133 transport charges. The R, G, and B elements 1R, 1G, and 1B need not necessarily include both of the first and second charge transport layers 131 and 133, but may include one of the first and second charge transport layers 131 and 133. Alternatively, the R, G, and B elements 1R, 1G, and 1B may include no first or second charge transport layers 131 and 133. The R, G, and B elements 1R, 1G, and 1B may each further include a hole or electron injection layer, in contact with the first electrode 12 or the second electrode 14R, 14G, or 14B, for injecting charges. For example, only the B element 1B may include the first charge transport layer 131. The term "charge transport layer" herein covers a layer for injecting charges.

The light-emitting layer 132R of the R element 1R emits red light, the light-emitting layer 132G of the G element 1G emits green light, and the light-emitting layer 132B of the B element 1B emits blue light. Alternatively, the light-emitting layers 132R, 132G, and 132B of the R, G, and B elements 1R, 1G, and 1B may emit white light with a plurality of emission peaks. In the case where the light-emitting layers 132R, 132G, and 132B of the R, G, and B elements 1R, 1G, and 1B emit white light, the first charge transport layers 131 of the R, G, and B elements 1R, 1G, and 1B have the same thickness, and the second charge transport layers 133 of the R, G, and B elements 1R, 1G, and 1B have the same thickness. Light of different colors can be extracted from the R, G, and B elements 1R, 1G, and 1B if the R, G, and B elements 1R, 1G, and 1B have different optical paths. When the R, G, and B elements 1R, 1G, and 1B include color filters, red, green, or blue light with high color purity can be extracted from the light-emitting layers 132.

The first electrodes 12 preferably have low light absorbance and high light reflectance and may be made of a metal such as silver, aluminum, gold, platinum, or chromium or an alloy containing such a metal. A transparent conductive member made of indium zinc oxide (hereinafter referred to as IZO) or indium tin oxide (hereinafter referred to as ITO) may be deposited on a light extraction side of the semitransparent reflective layer so as to serve as a reflective electrode.

The semitransparent reflective layer of the second electrode 14R is preferably made of a material having low light absorbance and high light reflectance. For example, the following material can be used to form a semitransparent reflective layer: a metal such as silver, aluminum, magnesium, calcium, gold, platinum, or chromium or an alloy containing such a metal. The semitransparent reflective layer thereof preferably has a thickness sufficient to achieve a reflectance of 5% or more and an absorbance of 50% or more. The semitransparent reflective layer thereof may preferably be made of silver and may have a thickness of 5 to 50 nm. A transparent layer made of IZO or ITO may be placed on a light extraction side of the second electrode 14R.

The transparent layers of the second electrodes 14G and 14B may be made of a transparent conductive material such as IZO or ITO.

In order to reflect light on the upper face of the second electrode 14G and the upper face of the second electrode 14B, a semitransparent reflective layer may be placed on a light extraction side of each of the second electrode 14G and the second electrode 14B.

Alternatively, in order to reflect light, a difference in refractive index may be used. For example, transparent electrode layers with high refractive index may be used instead of the second electrodes 14G and 14B and a low-refractive index layer may be placed on a light extraction side of each transparent electrode layer, whereby light can be reflected using a difference in refractive index. The transparent electrode layer is preferably made of a material with a refractive index of 1.5 or more. For example, IZO or ITO, which has a refractive index of about 1.9, is preferably used to form the transparent electrode layer. In order to form an effective resonant structure, the difference in refractive index between the low-refractive index layer and the transparent electrode layer is preferably 0.5 or more and more preferably 0.8 or more. Examples of a material for forming the low-refractive index layer include lithium fluoride and magnesium fluoride, which have a refractive index of about 1.4.

Second Embodiment

Figure 2:
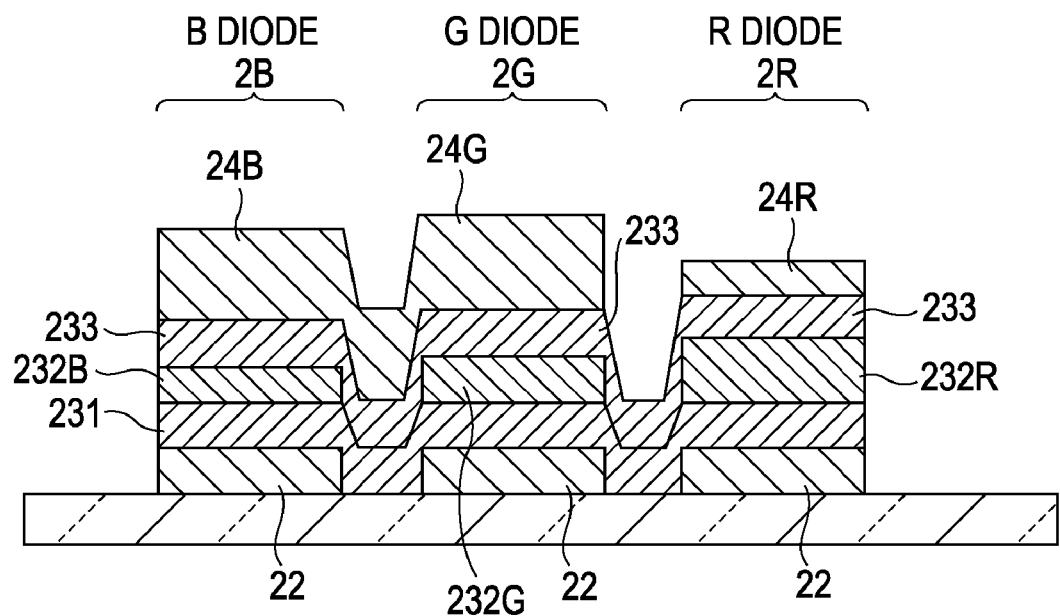
FIG. 2 is a schematic sectional view of an organic EL element array according to a second embodiment of the present invention.

FIG. 2 shows an organic EL element array according to a second embodiment of the present invention in cross-section. The organic EL element array includes R elements 2R, G elements 2G, and B elements 2B. The G and B elements 2G and 2B each include a first charge transport layer 231, a second charge transport layer 233, and a second electrode 24R, 24G, or 24B. The first charge transport layers 231 of the G and B elements 2G and 2B can be formed in the same step. The second charge transport layers 233 of the G and B elements 2G and 2B can be formed in the same step. The second electrodes 124G and 24B of elements 2G and 2B can be formed in the same step. Therefore, the organic EL element array can be manufactured by a simple method. The organic EL element array preferably further includes a film, which is not shown, for isolating the R, G, and B elements 2R, 2G, and 2B from each other.

Third Embodiment

Figure 3:
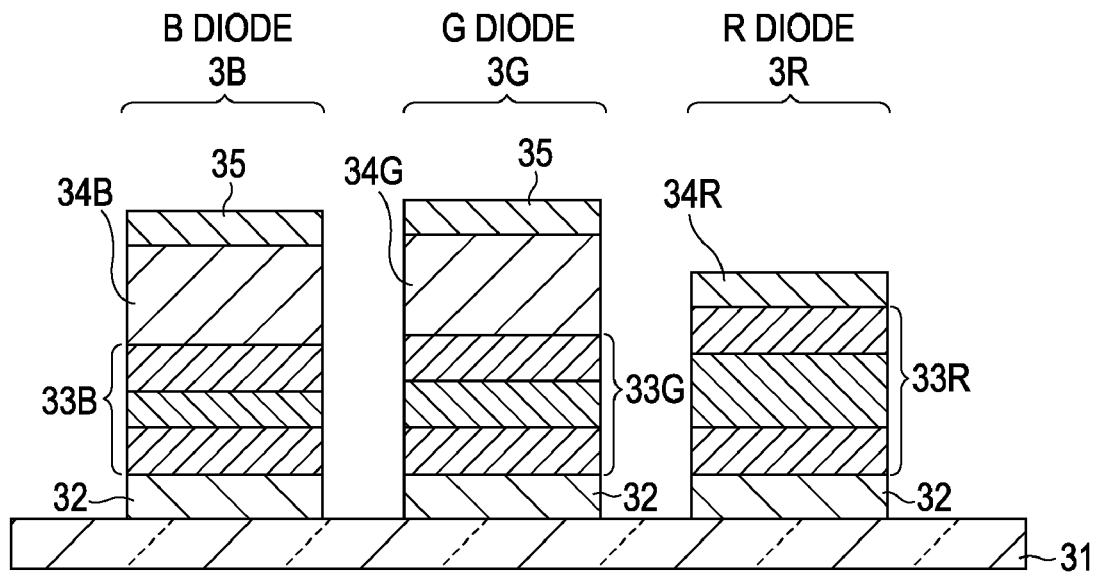
FIG. 3 is a schematic sectional view of an organic EL element array according to a third embodiment of the present invention.

FIG. 3 shows an organic EL element array according to a third embodiment of the present invention in cross-section. The organic EL element array includes R elements 3R, G elements 3G, and B elements 3B. Each R element 3R, each G element 3G, and each B element 3B include a second electrode 34R, a second electrode 34G, and a second electrode 34B, respectively. The B element 3B and the G element 3G each further include a semitransparent reflective layer 35 located on a light extraction side of the second electrode 34B or the second electrode 34G. The presence of the semitransparent reflective layer 35 increases the reflection of light at the interface between the semitransparent reflective layer 35 and the second electrode 34B or the second electrode 34G; hence, the amplification of light by resonance is enhanced. This enhances the light extraction efficiency of the B element 3B and the G element 3G. The R element 3R may further include a semitransparent reflective layer 35, transparent protective layer, or packed layer located on the second electrode 34R.

Fourth Embodiment

Figure 4:
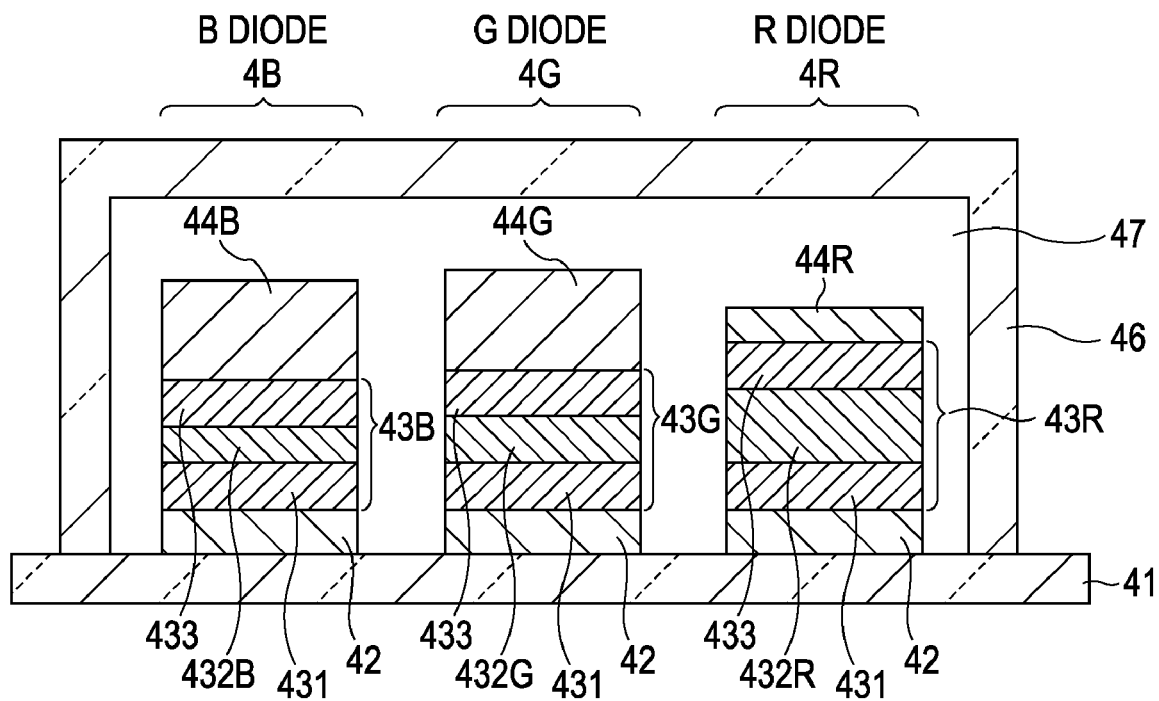
FIG. 4 is a schematic sectional view of an organic EL element array according to a fourth embodiment of the present invention.

FIG. 4 shows an organic EL element array according to a fourth embodiment of the present invention in cross-section. The organic EL element array includes a substrate 41, R elements 4R, G elements 4G, and B elements 4B. Each R element 4R, each G element 4G, and each B element 4B include a second electrode 44R, a second electrode 44G, and a second electrode 44B, respectively. The organic EL element array further includes a protective member 46 for protecting the R, G, and B elements 4R, 4G, and 4B. The protective member 46 is located on a light extraction side of each of the second electrode 44R, 44G, and 44G and is spaced from the R, G, and B elements 4R, 4G, and 4B. The space between the protective member 46 and the R, G, and B elements 4R, 4G, and 4B may be filled with gas 47. The gas 47 is preferably inert. Examples of an inert gas include gaseous nitrogen and argon, which have a refractive index of about 1.0. When the second electrodes 44R, 44G, and 44B are made of IZO and the space therebetween is filled with gaseous nitrogen, the interface between nitrogen and each of the second electrodes 44R, 44G, and 44B has a reflectance of about 10%. Alternatively, the space therebetween may be filled with air. When the space therebetween is filled with the gas 47, no layer needs to be placed on a light extraction side of each of the second electrodes 44R, 44G, and 44B. Therefore, the organic EL element array can be manufactured by a simple method.

The protective member 46 may be made of an air-impermeable material and is preferably made of a transparent material such as glass if light is extracted through the protective member 46. The protective member 46 is preferably bonded to the substrate 41 with an adhesive such that no space is present therebetween.

Other Embodiments

The organic EL element arrays according to the first to fourth embodiments are as described above. The present invention is not limited to these embodiments. An organic EL element array according to another embodiment of the present invention need not include R elements, G elements, and B elements and may include EL elements emitting red light, elements emitting green light, elements emitting blue light, and elements emitting light of another color such as white or yellow.

An organic EL element array according to an embodiment of the present invention may be an active matrix-type organic EL element array including a circuit for individually controlling elements or a passive matrix-type organic EL element array including stripe electrodes which intersect with each other and of which the intersections are used to emit light. When this organic EL element array is such an active matrix-type organic EL element array, voltages for driving elements emitting light of different colors are preferably close to each other. According to the present invention, an organic compound layer included in each R element having relatively high light-emitting efficiency has a thickness greater than that of an organic compound layer included in each B element having relatively low light-emitting efficiency; hence, a difference between voltages for driving the R and B elements is small.

An organic EL element array according to an embodiment of the present invention may be a bottom emission-type organic EL element array in which light is extracted through a substrate or a top emission-type organic EL element array in which light is extracted through a member located on the side opposite to a substrate. Electrodes arranged close to a substrate may be cathodes or anodes.

The light extraction efficiency of an organic EL element array according to an embodiment of the present invention can be enhanced in such a manner that light is repeatedly reflected between two interfaces so as to be amplified by resonance or in such a manner that the optical path between a luminescent plane in each organic compound layer and a reflective face of each reflective electrode is adjusted. This is because a light beam traveling from the luminescent plane to a second electrode interferes with another light beam that travels from the luminescent plane to a first electrode, is reflected by the first electrode, and then travels toward the second electrode and therefore the light beams are amplified.

An organic EL element array according to an embodiment of the present invention includes a plurality of organic EL devices and therefore can be used as a display. This organic EL element array is suitable for use in a display section of a digital camera, a mobile phone, or a television.

EXAMPLES

The present invention will now be further described in detail with reference to examples.

Example 1

An organic EL element array similar to that shown in FIG. 4 was prepared as described below. The organic EL element array included a substrate 41, R elements 4R, G elements 4G, and B elements 4B. Each R element 4R included a first electrode 42, a hole transport layer 431, a red light-emitting layer 432R, an electron transport layer 433, and a second electrode 44R in sequence. Each G element 4G included a first electrode 42, a hole transport layer 431, a green light-emitting layer 432G, an electron transport layer 433, and a second electrode 44G in sequence. Each B element 4B included a first electrode 42, a hole transport layer 431, a blue light-emitting layer 432B, an electron transport layer 433, and a second electrode 44B in sequence.

The first electrodes 42 each including a reflective layer and a transparent layer were formed in such a manner that a silver alloy film with a thickness of about 100 nm was deposited on the substrate 41 by a sputtering process, an IZO film with a thickness of about 20 nm was deposited on the silver alloy film by a sputtering process, and the silver alloy film and the IZO film were then etched such that the reflective layers and the transparent layers were formed. Each transparent layer was located on a light extraction side of each reflective layer. A hole transport material A was deposited on the first electrodes 42 by vapor deposition, whereby the hole transport layers 431 were formed. The hole transport layer 431 of the R element 4R had a thickness of about 30 nm. The hole transport layer 431 of the G element 4G and that of the B element 4B had a thickness of about 20 nm. A red light-emitting material A was deposited on the hole transport layer 431 of the R element 4R, whereby the red light-emitting layer 432R was formed. A green light-emitting material A was deposited on the hole transport layer 431 of the G element 4G, whereby the green light-emitting layer 432G was formed. A blue light-emitting material A was deposited on the hole transport layer 431 of the B element 4B, whereby the blue light-emitting layer 432B was formed. The red, green, and blue light-emitting layers 432R, 432G, and 432B had a thickness of about 40, 30, and 20 nm, respectively. An electron transport material A was deposited on the red, green, and blue light-emitting layers 432R, 432G, and 432B, whereby the electron transport layers 433 were formed. The electron transport layers 433 had a thickness of about 30 nm. Silver was deposited on the electron transport layer 433 of the R element 4R by vapor deposition using a shadow mask, whereby the second electrode 44R was formed. IZO was deposited on the electron transport layers 433 of the G and B elements 4G and 4B by a sputtering process, whereby the second electrodes 44G and 44B were formed. The second electrode 44R had a thickness of about 15 nm and the second electrodes 44G and 44B had a thickness of about 60 nm. All the layers formed by vapor deposition were separately formed using shadow masks. A glass protective cap was provided on the substrate 41 so as to cover the R, G, and B elements 4R, 4G, and 4B. The space between the glass protective cap and the R, G, and B elements 4R, 4G, and 4B was filled with gaseous nitrogen. Light was reflected by the interface between the second electrode 44B and nitrogen because of the difference in refractive index.

In the R element 4R, light was repeatedly reflected between the following interfaces: the interface between the reflective layer and the transparent layer and the interface between the second electrode 44R and the electron transport layer 433. These portions of the R element 4R formed a resonant section and therefore the R element 4R had a resonant structure. In each of the G and B element 4G and 4B, light was repeatedly reflected between the following interface and face: the interface between the reflective layer and the transparent layer and a light-extracting face of the second electrode 44R or 44B and gaseous nitrogen. These portions formed a resonant section and therefore the G and B element 4G and 4B had a resonant structure. In the organic EL element array, the R, G, and B elements 4R, 4G, and 4B had an adjusted optical path suitable for increasing the light extraction efficiency by resonance.

Comparative Example 1

An organic EL element array was prepared in substantially the same manner as that described in Example 1 except that R elements each included a second electrode, made of IZO, having a thickness of about 60 nm. The second electrode had a reflective face, located on a light extraction side, serving as an interface. The optical path between interfaces present in each R element was greater than that of Example 1. This did not meet conditions for enhancing the light extraction efficiency.

Comparative Example 2

An organic EL element array was prepared in substantially the same manner as that described in Example 1 except that R elements each included a second electrode, made of IZO, having a thickness of about 60 nm and a light-emitting layer having a thickness of about 80 nm. The distance between interfaces present in each R element of this comparative example was greater than that of Comparative Example 1. Therefore, the R element had such an optical path that the order of interference of the R element was one greater than that of each R element of Example 1.

Evaluation

Table 1 shows the driving voltage, chromaticity, and light-emitting efficiency of the R elements 4R of Example 1 and Comparative Examples 1 and 2. In the organic EL element array of Example 1, the R elements 4R have high light-emitting efficiency without depending on whether the hole transport layer of each R element, that of each G element, and each B element are the same as or different from each other. In the organic EL element array of Comparative Example 1, since the second electrode of each R element 4R as well as those of the G and B elements 4G and 4B has a thickness of about 60 nm and is made of IZO, light is not reflected by the interface between the second electrode and electron transport layer of the R element 4R but a light-extracting face of the second electrode. The optical path between this interface and the light-extracting face is greater than that between the interfaces present in each R element of Example 1 and is suitable for amplifying light having a wavelength less than that of light emitted from the light-emitting layer of the R element 4R of Comparative Example 1. Therefore, the chromaticity of light extracted from the R element 4R of Comparative Example 1 is varied and therefore this R element 4R has low light-emitting efficiency.

In the organic EL element array of Comparative Example 2, since the second electrode of each R element as well as those of the G and B elements has a thickness of about 60 nm and is made of IZO and the light-emitting layer of the R element has a thickness of about 80 nm, this R element has higher light-emitting efficiency as compared to that of the R element of Comparative Example 1 because the optical path of the resonant section is adjusted such that the chromaticity of light extracted from this R element is close to that of light extracted from the R element of Comparative Example 1; however, the driving voltage of this R element is significantly greater than that of the R element of Comparative Example 1.

In the organic EL element array of Example 1, the G elements 4G have a driving voltage of about 4.1 V and a light-emitting efficiency of about 2.1 cd/A and the B elements 4B have a driving voltage of about 4.0 V and a light-emitting efficiency of about 1.4 cd/A. The G and B elements 4G and 4B of Comparative Examples 1 and 2 and Example 1 have substantially the same configuration and therefore have substantially the same driving voltage and the same light-emitting efficiency.

These results show that the organic EL element array of Example 1 is superior in driving voltage and light-emitting efficiency to the organic EL element arrays of Comparative Examples 1 and 2.

Figure 5:
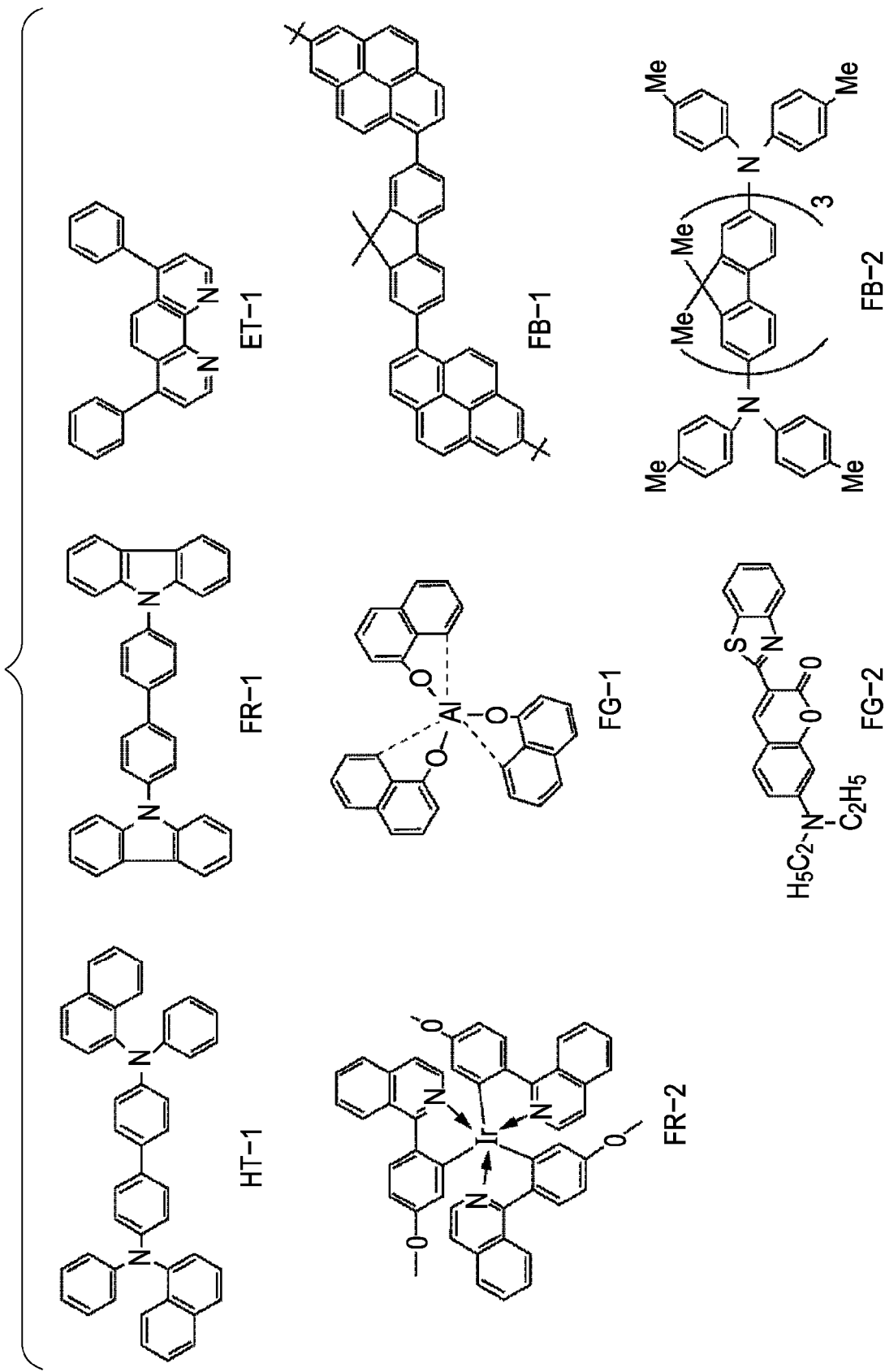
FIG. 5 is an illustration showing the structural formulas of materials used in examples of the present invention.

The driving voltage and light-emitting efficiency of each R element prepared in Example 1, or Comparative Example 1 or 2 were determined in such a manner that a voltage was applied to the R element such that the R element had a current density of about 10 mA/cm2. The chromaticity of the R element is expressed in CIE coordinates. The materials used in Example 1 and Comparative Examples 1 and 2 contain compounds shown in FIG. 5 and have compositions shown in Table 2. The pressure during vapor deposition performed in Example 1 and Comparative Examples 1 and 2 is about $5 \times 10^{-4}$ Pa.

TABLE 1

|  | Driving voltage (V) | Chromaticity (CIE coordinates) | Light-emitting Efficiency (cd/A) |
|---|---|---|---|
| Example 1 | 5.6 | (0.65, 0.35) | 17 |
| Comparative Example 1 | 6.0 | (0.63, 0.35) | 7 |
| Comparative Example 2 | 8.2 | (0.65, 0.35) | 12 |

TABLE 2

|  | Composition (Volume basis) |
|---|---|
| Hole transport material A | 100% HT-1 |
| Electron transport material A | 97% ET-1 and 3% $CsCO_3$ |
| Green light-emitting material A | 99% FG-1 and 1% FG-2 |
| Red light-emitting material A | 90% FR-1 and 10% FR-2 |
| Blue light-emitting material A | 90% FB-1 and 10% FB-2 |

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-232354 filed Aug. 29, 2006, which is hereby incorporated by reference herein in its entirety.

What is claimed is:

1. An organic electroluminescent element array comprising:
   a substrate;
   a first organic electroluminescent element emitting red light;
   a second organic electroluminescent element emitting green light; and
   a third organic electroluminescent element emitting blue light, the first, second, and third organic electroluminescent elements being disposed on the substrate,
   wherein the first, second, and third organic electroluminescent elements each include a first electrode, an organic compound layer which emits light, and a light-transmissive second electrode arranged on the substrate in that order; the light emitted by each of the organic electroluminescent elements is extracted through the second electrode; the second electrode of each first organic electroluminescent element has a semitransparent reflective layer; the first electrode of the first organic electroluminescent element has a reflective face and a resonant structure located between the reflective face and the semitransparent reflective layer; the second electrode of each second organic electroluminescent element and the second electrode of each third organic electroluminescent element each have a transparent layer having a light-extracting face through which light is extracted; the first electrode of the second organic electroluminescent element and the first electrode of the third organic electroluminescent element each have a reflective face; the second and third organic electroluminescent elements each have a resonant structure located between the reflective face of the first electrode of the second or third organic electroluminescent element and the light-extracting face of the transparent layer of the second or third organic electroluminescent element; and the optical path between the reflective face of the first electrode of the first organic electroluminescent element and the semitransparent reflective layer and the optical path between the reflective face of the first electrode of the second or third organic electroluminescent element and the light-extracting face of the transparent layer of the second or third organic electroluminescent element each satisfy one of the following equations:

$$2L_1/\lambda_1 + \Phi_1/2\Pi = 1$$

$$2L_2/\lambda_2 + \Phi_2/2\Pi = 2$$

where $L_1$ represents the optical path between the reflective face of the first electrode of the first organic electroluminescent element and the semitransparent reflective layer, $L_2$ represents the optical path between the reflective face of the first electrode of the second or third organic electroluminescent element and the light-extracting face of the transparent layer of the second or third organic electroluminescent element, $\lambda_1$ represents the peak wavelength of the emission spectrum of the first organic electroluminescent element, $\lambda_2$ represents the peak wavelength of the emission spectrum of the second or third organic electroluminescent element, $\Phi_1$ represents the sum of the phase shift at the reflective face of the first electrode of the first organic electroluminescent element and the phase shift at the semitransparent reflective layer; and $\Phi_2$ represents the sum of the phase shift at the reflective face of the first electrode of the second or third organic electroluminescent element and the phase shift at the light-extracting face of the transparent layer of the second or third organic electroluminescent element.

2. The organic electroluminescent element array according to claim 1, wherein the organic compound layer includes a light-emitting sublayer and a charge transport sublayer and the charge transport sublayer is shared by a portion of the first, second, and third organic electroluminescent elements.

3. The organic electroluminescent element array according to claim 1, wherein the semitransparent reflective layer is located on a light extraction side of the transparent layer.

4. The organic electroluminescent element array according to claim 1, further comprising a protective member which protects the first, second, and third organic electroluminescent elements and said protective member is located on a light extraction side of each second electrode and spaced from the first, second, and third organic electroluminescent elements and wherein the space between the protective member and the first, second, and third organic electroluminescent elements is filled with gas.

5. The organic electroluminescent element array according to claim 1, which is an active matrix-type array including a circuit for individually controlling the organic electroluminescent elements.

* * * * *